(12) United States Patent
Mohseni et al.

(10) Patent No.: US 12,089,509 B2
(45) Date of Patent: Sep. 10, 2024

(54) QUANTUM HARDWARE CHARACTERIZED BY PROGRAMMABLE BOSE-HUBBARD HAMILTONIANS

(71) Applicant: Google LLC, Mountain View, CA (US)

(72) Inventors: Masoud Mohseni, Redondo Beach, CA (US); Hartmut Neven, Malibu, CA (US)

(73) Assignee: Google LLC, Mountain View, CA (US)

( * ) Notice: Subject to any disclaimer, the term of this patent is extended or adjusted under 35 U.S.C. 154(b) by 37 days.

(21) Appl. No.: 16/752,404

(22) Filed: Jan. 24, 2020

(65) Prior Publication Data

US 2020/0161530 A1 May 21, 2020

Related U.S. Application Data

(63) Continuation of application No. 15/112,642, filed as application No. PCT/US2015/011995 on Jan. 20, 2015, now abandoned.

(60) Provisional application No. 61/929,921, filed on Jan. 21, 2014.

(51) Int. Cl.
*H01L 39/02* (2006.01)
*G06N 10/00* (2022.01)
*H10N 60/80* (2023.01)
*G06N 7/01* (2023.01)

(52) U.S. Cl.
CPC .......... *H10N 60/805* (2023.02); *G06N 10/00* (2019.01); *G06N 7/01* (2023.01)

(58) Field of Classification Search
CPC .......... G06N 7/005; G06N 10/00; G06N 7/01; H01L 39/025; H10N 60/805
See application file for complete search history.

(56) References Cited

U.S. PATENT DOCUMENTS

| | | |
|---|---|---|
| 6,897,468 B2 | 5/2005 | Blais |
| 6,960,780 B2 | 11/2005 | Blais |
| 7,135,701 B2 | 11/2006 | Amin |

(Continued)

OTHER PUBLICATIONS

Zheng et al., "Superfluid—Mott-insulator transition in superconducting circuits with weak anharmonicity," arXiv (2017).*

(Continued)

*Primary Examiner* — Jay C Kim
(74) *Attorney, Agent, or Firm* — Fish & Richardson P.C.

(57) ABSTRACT

An apparatus includes a first group of superconducting cavities and a second group of superconducting cavities, each of which is configured to receive multiple photons. The apparatus includes couplers, where each coupler couples one superconducting cavity from the first group with one cavity from the second group such that the photons in the coupled superconducting cavities interact. A first superconducting cavity of the first group is connected to a second superconducting cavity of the second group, such that photons of the first and second superconducting cavities are shared by each of the first and second superconducting cavities. The first superconducting cavity is coupled to at least one other superconducting cavity of the first group to which the second superconducting cavities are coupled, and the second superconducting cavity is coupled to at least one other superconducting cavity of the second group to which the first superconducting cavities are coupled.

6 Claims, 5 Drawing Sheets

(56) References Cited

U.S. PATENT DOCUMENTS

| | | | |
|---|---|---|---|
| 7,343,059 B2 | 3/2008 | Beausoleil | |
| 7,418,283 B2 | 8/2008 | Amin | |
| 7,451,292 B2 | 11/2008 | Routt | |
| 7,613,765 B1 | 11/2009 | Hilton | |
| 7,893,708 B2 | 2/2011 | Baumgardner | |
| 7,932,514 B2 | 4/2011 | Farinelli | |
| 8,111,083 B1 | 2/2012 | Pesetski | |
| 8,195,596 B2 | 6/2012 | Rose et al. | |
| 8,242,799 B2 | 8/2012 | Pesetski et al. | |
| 8,560,282 B2 | 10/2013 | Macready | |
| 8,571,614 B1 | 10/2013 | Mukhanov | |
| 8,631,367 B2 | 1/2014 | Pesetski | |
| 8,642,998 B2 | 2/2014 | Gambetta | |
| 8,817,254 B2 | 8/2014 | Santori | |
| 8,837,544 B2 | 9/2014 | Santori | |
| 8,841,764 B2 | 9/2014 | Poletto | |
| 8,975,912 B2 | 3/2015 | Chow | |
| 9,111,230 B2 | 8/2015 | Gambetta | |
| 9,350,460 B2 | 5/2016 | Paik | |
| 9,379,303 B2 | 6/2016 | Gambetta | |
| 9,425,804 B2 | 8/2016 | McDermott, III | |
| 9,473,124 B1 | 10/2016 | Mukhanov | |
| 9,485,849 B1 | 11/2016 | Vetter | |
| 2005/0256007 A1 | 11/2005 | Amin et al. | |
| 2009/0074355 A1 | 3/2009 | Beausoleil | |
| 2010/0183217 A1 | 7/2010 | Seung et al. | |
| 2010/0276661 A1 | 11/2010 | Ahn | |
| 2012/0319085 A1 | 12/2012 | Gambetta et al. | |
| 2016/0104073 A1 | 4/2016 | Sandberg | |

OTHER PUBLICATIONS

Koch et al., "Superfluid—Mott-insulator transition of light in the Jaynes-Cummings lattice," Physical Review A 80 (2009) 023811.*

Schmidt et al., "Circuit QED lattices Towards quantum simulation with superconducting circuits," Annals of Physics (Berlin) 525 (2013) pp. 395-412.*

Chen et al., "Bistable Mott-insulator-to-superfluid phase transition in cavity optomechanics," Physical Review A 80 (2009) 011801 (R).*

Rossini et al., "Mott-Insulating and Glassy Phases of Polaritons in 1D Arrays of Coupled Cavities," Physical Review Letters 99 (2007) 186401.*

Bertet et al., "Dephasing of a Superconducting Qubit Induced by Photon Noise", Physical Review Letters, year 2005.

Bishop, "Circuit Quantum Electrodynamics", PhD Dissertation at Yale (2010).

Blais et al. "Cavity quantum electrodynamics for superconducting electrical circuits: An architecture for quantum computation," Physical Review A 69, 062320, 2004, 14 pages.

Blais et al., "Cavity quantum electrodynamics tor superconducting electrical circuits: an architecture for quantum computation," arXiv:cond-mat/0402216, Feb. 7, 2004, pp. 1-14.

Bothner et al., "Inductively coupled superconducting half wavelength resonators as persistent current traps for ultracold atoms ", New Journal of Physics 15 (2013) 093024.

Denil et al, "Toward the Implementation of Quantum RBM" NIPS, 2011, 9 pages.

Du et al., "Integrated photonic qubit quantum computing on a superconducting chip", New Journal of Physics 12, year 2010.

Girvin et al., "Circuit QED and engineering charge-based superconducting qubits", Phys. Scr. T137 (2009) 014012.

Helmer et al., "Cavity grid for scalable quantum computation with superconduting circuits", arXiv.org (2009).

Majer et al. "Coupling Superconducting qubits via a cavity bus," Nature, vol. 449, Sep. 27, 2007, 5 pages.

PCT International Preliminary Report on Patentability in International Application No. OCT/US2015/011995, dated Jul. 26, 2016, 6 pages.

PCT International Search Report and Written Opinion in International Application No. PCT/US2015/11995, mailed Oct. 1, 2015, 6 pages.

Schuster et al., "Resolving photon number states in a superconducting circuit", Nature, year 2007, pp. 515-518.

Wallraff et al. "Strong Coupling of a single photon to a superconducting qubit using circuit quantum electrodynamics," Nature, vol. 431, Sep. 9, 2004, 6 pages.

Yang et al. "Entanglement Generation and quantum information transfer between spatially-separated qubits in different cavities," New J. Phys. 15 115003, Nov. 1, 2013, 15 pages.

CA Office Action in Canadian Appln. No. 2,937,324, dated Apr. 28, 2020, 6 pages.

CA Office Action in Canadian Appln. No. 2,937,324, dated Apr. 14, 2021, 4 pages.

Siddiqi, "Superconducting qubits: poised for computing?," Supercond. Sci. Technol., 2011, 24:091002.

Office Action in Canadian Appln. No. 3,128,586, dated Oct. 4, 2022, 5 pages.

* cited by examiner

QUANTUM HARDWARE CHARACTERIZED BY PROGRAMMABLE BOSE-HUBBARD HAMILTONIANS

CROSS-REFERENCE TO RELATED APPLICATIONS

This application is a continuation of U.S. application Ser. No. 15/112,642, filed on Jul. 19, 2016, which is a National Stage Application under 35 U.S.C. § 371 and claims the benefit of International Application No. PCT/US2015/011995, filed on Jan. 20, 2015, which claims priority to U.S. Provisional Application No. 61/929,921, filed on Jan. 21, 2014. The disclosure of the prior applications are considered part of and are incorporated by reference in the disclosure of this application.

BACKGROUND

The present specification relates to quantum hardware characterized by programmable Bose-Hubbard Hamiltonians.

SUMMARY

In a computational paradigm of this specification, quantum information is represented by multimode quantum hardware, the dynamics of which can be characterized and controlled by a programmable many-body quantum Hamiltonian. The multimode quantum hardware can be programmed as, for example, a quantum processor for certain machine learning problems. Examples of the quantum hardware include neutral atoms on optical lattices, photonic integrated circuits, or superconducting cavity quantum electrodynamics (QED) circuits, and the Hamiltonians characterizing such quantum hardware include dissipative or non-dissipative Bose-Hubbard Hamiltonians.

The solution to a machine optimization problem can be encoded into an energy spectrum of a Bose-Hubbard quantum Hamiltonian. For example, the solution is encoded in the ground state of the Hamiltonian. Through an annealing process in which the Hamiltonian evolves from an initial Hamiltonian into a problem Hamiltonian, the energy spectrum or the ground state of the Hamiltonian for solving the problem can be obtained without diagonalizing the Hamiltonian. The annealing process may not require tensor product structure of conventional qubits or rotations and measurements of conventional local single qubits. In addition, quantum noise or dechoerence can act as a recourse to drive the non-equilibrium quantum dynamics into a non-trivial steady state. The quantum hardware can be used to solve a richer set of problems as compared to quantum hardware represented by an Ising Hamiltonian. Furthermore, instead of the binary representations provided by the Ising Hamiltonians, constraint functions of problems to be solved can have a digital representation according to the density of states in Cavity QED modes.

In general, in some aspects, the subject matter of the present disclosure can be embodied in apparatuses that include: a first group of superconducting cavities each configured to receive multiple photons; a second group of superconducting cavities each configured to receive multiple photons; and multiple couplers, in which each coupler couples one superconducting cavity from the first group of superconducting cavities with one superconducting cavity from the second group of superconducting cavities such that the photons in the coupled superconducting cavities interact, and in which a first superconducting cavity of the first group of superconducting cavities is connected to a second superconducting cavity of the second group of superconducting cavities, such that photons of the first and second superconducting cavities are shared by each of the first and second superconducting cavities, the first superconducting cavity is coupled to one or more of the other superconducting cavities of the first group of superconducting cavities to which the second superconducting cavities are coupled, and the second superconducting cavity is coupled to one or more of the other superconducting cavities of the second group of superconducting cavities to which the first superconducting cavities are coupled.

Various implementations of the apparatuses are possible. For example, in some implementations, each coupler is configured to annihilate a photon in one superconducting cavity and create a photon in a different superconducting cavity.

In some implementations, at least one of the couplers includes a Josephson junction.

In some implementations, a Hamiltonian characterizing the apparatus is: $\Sigma_i h_i n_i + \Sigma_{i,j} t_{i,j}(a_i^\dagger a_j + \text{h.c.}) + \Sigma_i U_i n_i(n_i-1)$, in which $n_i$ is a particle number operator and denotes occupation number of a cavity mode i, $a_i^\dagger$ is a creation operator that creates a photon in cavity mode i, $a_j$ is an annihilation operator that annihilates a photon in cavity mode j, $h_i$ corresponds to a site disorder, $U_i$ corresponds to an on-site interaction, $t_{i,j}$ are the hopping matrix elements, and h.c. is hermitian conjugate. In some implementations, the multiple couplers are trained to produce an output desired probability density function at a subsystem of interest at an equilibrium state of the apparatus. In some implementations, the apparatuses are trained as Quantum Boltzmann machines.

In some implementations, wherein a Hamiltonian characterizing the apparatus is: $\Sigma_i h_i n_i + \Sigma_{i,j} t_{i,j}(a_i^\dagger a_j + \text{h.c.}) + \Sigma_i U_i n_i(n_i-1) + \Sigma_{i,j} U_{i,j} n_i n_j$, in which $n_i$ is a particle number operator and denotes occupation number of a cavity mode i, $a_i^\dagger$ is a creation operator that creates a photon in cavity mode i, $a_j$ is an annihilation operator that annihilates a photon in cavity mode j, $h_i$ corresponds to a site disorder, $U_i$ corresponds to an on-site interaction, $t_{i,j}$ are the hopping matrix elements, and h.c. is hermitian conjugate. The apparatuses can be operable to evolve adiabatically to a ground state of a problem Hamiltonian $H_p = \Sigma_i h_i n_i + \Sigma_i U_i n_i(n_i-1) + \Sigma_{i,j} U_{i,j} n_i n_j$. The apparatus can be operable to evolve adiabatically from a Mott-insulator state to a superfluid state, in which an initial Hamiltonian of the apparatus is $H_i = \Sigma_{i,j} t_{i,j}(a_i^\dagger a_j + \text{h.c.})$. The apparatus can be operable to evolve adiabatically from a Mott-insulator state to a ground state of a problem Hamiltonian $H_p = \Sigma_i h_i n_i + \Sigma_i U_i n_i(n_i-1) + \Sigma_{i,j} U_{i,j} n_i n_j$, in which an initial Hamiltonian of the apparatus is $H_i = \Sigma_{i,j} t_{i,j}(a_i^\dagger a_j + \text{h.c.})$.

In some implementations, the apparatus is configured to respond to an external field $\varepsilon(t)$ and a Hamiltonian characterizing the apparatus in the external field is: $\Sigma_i h_i n_i + \Sigma_{i,j} t_{i,j} (a_i^\dagger a_j + \text{h.c.}) + \Sigma_i U_i n_i(n_i-1) + \Sigma_i [\varepsilon(t) a_i^\dagger + \varepsilon(t)^* a_i] + H_{SB}$, in which $H_{SB} = \Sigma_i \Sigma_\nu [\kappa_{i,\nu}(a_i b_\nu^\dagger + a_i^\dagger b_\nu) + \lambda^{i,\nu} a_i^\dagger a_i (b_\nu + b_\nu^\dagger)]$, and in which $n_i$ is a particle number operator, $\varepsilon(t)$ is a slowly-varying envelope of an externally applied field to compensate for photon loss, $H_{SB}$ is a Hamiltonian of the interaction between the apparatus and a background bath in which the apparatus is located, $b_\nu$, and $b_\nu^\dagger$ are annihilation and creation operators for a bosonic background bath environment, $\kappa_{i,\nu}$ is a strength of apparatus-bath interactions corresponding to exchange of energy, $h_i$ corresponds to a site disorder, $U_i$ corresponds to an on-site interaction, $t_{i,j}$ are the hopping matrix elements, and $\lambda_{i,\nu}$ corresponds to a strength of local photon occupation fluctuations due to exchange of phase with the bath. The apparatus can be operable to be dissipatively-driven to a ground state of a problem Hamiltonian.

In some implementations, at least one cavity is a 2D cavity. For example, each cavity can be a 2D cavity.

In some implementations, at least one cavity is a 3D cavity. For example, each cavity can be a 3D cavity.

In some implementations, each superconducting cavity in the first group of superconducting cavities is connected to a superconducting cavity in the second group of superconducting cavities.

In general, in other aspects, the subject matter of the present disclosure can be embodied in methods that include providing an apparatus having: a first group of superconducting cavities each configured to receive multiple photons; a second group of superconducting cavities each configured to receive multiple photons; and multiple couplers, in which each coupler couples one superconducting cavity from the first group of superconducting cavities with one superconducting cavity from the second group of superconducting cavities such that the photons in the coupled superconducting cavities interact, and in which a first superconducting cavity of the first group of superconducting cavities is connected to a second superconducting cavity of the second group of superconducting cavities, such that photons of the first and second superconducting cavities are shared by each of the first and second superconducting cavities, the first superconducting cavity is coupled to one or more of the other superconducting cavities of the first group of superconducting cavities to which the second superconducting cavities are coupled, and the second superconducting cavity is coupled to one or more of the other superconducting cavities of the second group of superconducting cavities to which the first superconducting cavities are coupled. The apparatus can be provided in an initial Mott-insulated state. The methods can further include causing a quantum phase transition of the apparatus from the initial Mott-insulator state to a superfluid state; and adiabatically guiding the apparatus to a problem Hamiltonian.

Various implementations of the methods are possible. For example, in some implementations, the methods can further include causing a quantum phase transition of the apparatus from the superfluid state to a final Mott-insulator state and reading the state of each superconducting cavity in the apparatus. The details of one or more embodiments of the subject matter of this specification are set forth in the accompanying drawings and the description below. Other features, aspects, and advantages of the subject matter will become apparent from the description, the drawings, and the claims.

DETAILED DESCRIPTION

Figure 1:
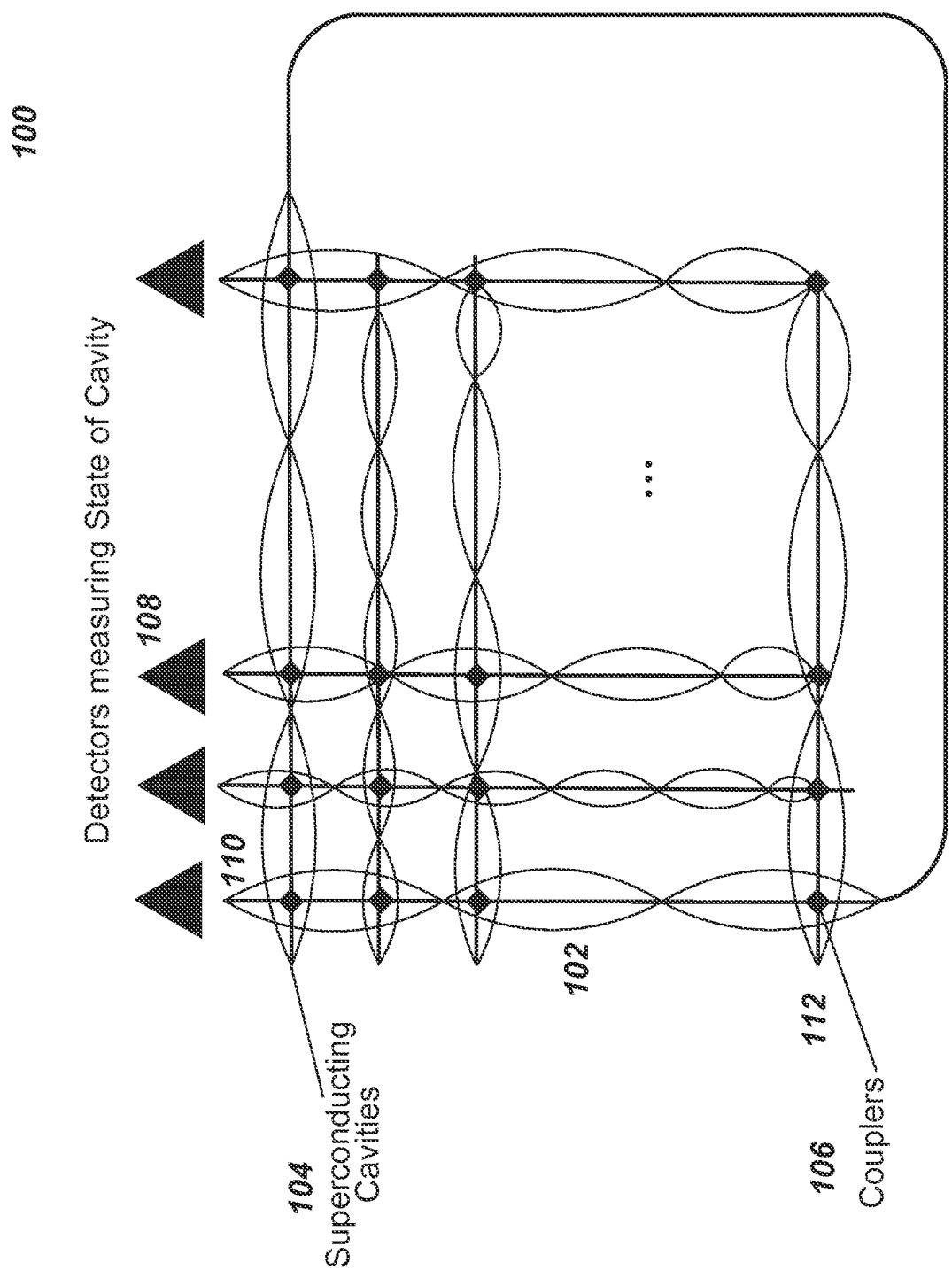
FIG. 1 is a schematic of an example structure of quantum hardware.

FIG. 1 is a schematic of an example structure of quantum hardware 100 that can be characterized by programmable Bose-Hubbard Hamiltonians. The quantum hardware 100 includes QED cavities 104 arranged in columns 110, and lines 112. At least some pairs of the QED cavities, such as cavities 110 and 112, are coupled to each other through coupler 106. The QED cavities can be superconducting waveguide cavities restricted in dimensionality, e.g., to 1D, 2D or 3D. The couplers 106 can be inductive couplers, and the hardware can be configured with resistors and inductors. The couplers 106 can be Josephson couplers, and in an example, a Josephson coupler is constructed by connecting two superconducting elements separated by an insulator and a capacitance in parallel.

The cavities contain photons in optical modes 102. The cavities can receive a variable amount of photons when the quantum hardware is initialized, or during the use of the quantum hardware. A coupler 106 between two cavities allows the photons of the two cavities to interact with each other. For example, the coupler can create or annihilate photons in a cavity, or move photons between cavities. Each cavity in the hardware 100 can be used as a logical computation unit. The number of photons in a cavity mode of the cavity can be read using photon detectors 108.

In some implementations, the quantum hardware 100 includes a fully connected network of superconducting cavities 104. In this network, each cavity is coupled with all other cavities through couplers 106. In other implementations, selected pairs of cavities are coupled with each other. The selection can be made based on the need for the quantum computation and the physical confinement of the hardware.

Figure 2A:
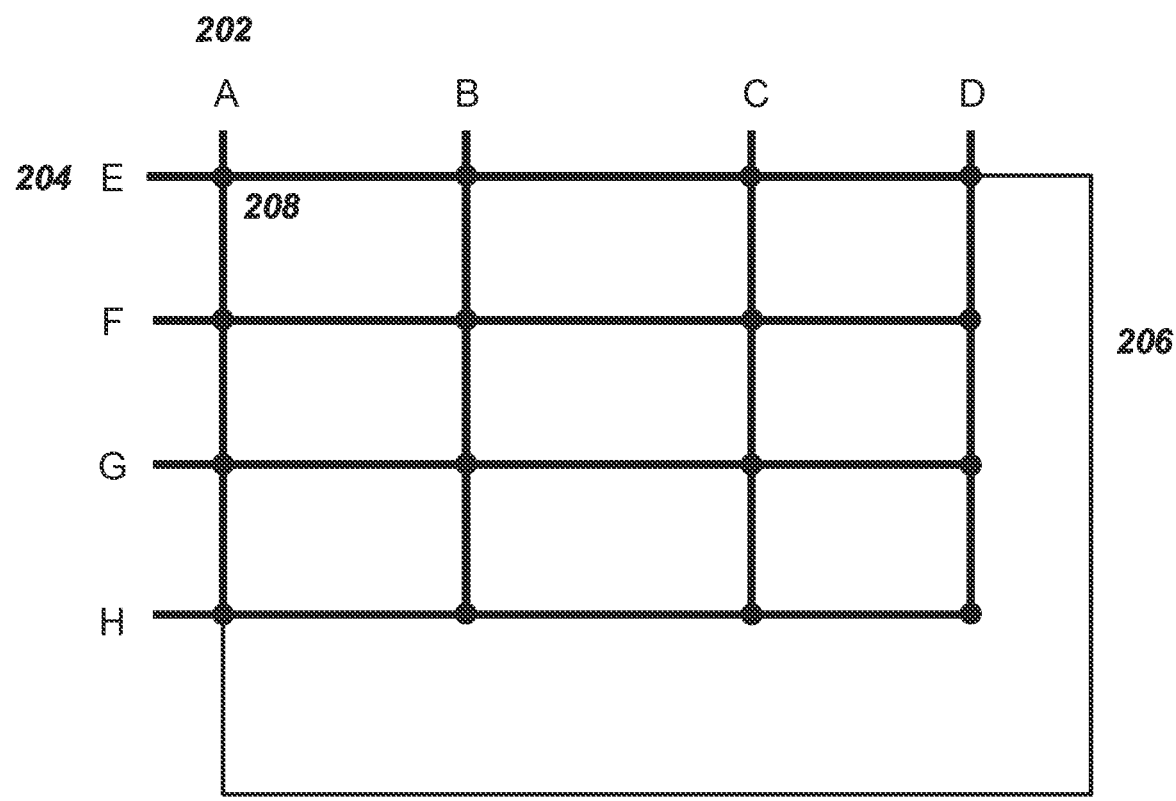
FIG. 2A is an example of a selected connection in quantum hardware.

FIG. 2A is an example of a selected connection in quantum hardware. The hardware includes cavities A, B, C, D, E, F, G, and H, and pairs of cavities are coupled through couplers 208. Cavities "A" 202 and "E" 204 are selected to be connected through a connection 206, so that effectively, they become the same cavity. That is, the connection can be considered an extension of the cavity QED mode. Without the connection 206, the cavity "A" is coupled to cavities "E", "F", "G", and "H," but not to cavities B, C, and D.

Effectively, in this example, cavity "A" is coupled to all other cavities of the hardware. However, cavities "B"-"H" are only coupled to selected cavities of the hardware. To increase the number of cavities each cavity is coupled to, additional connections similar to the connection 206 can be added. The total amount of interaction between cavities in the hardware can be increased.

Figure 2B:
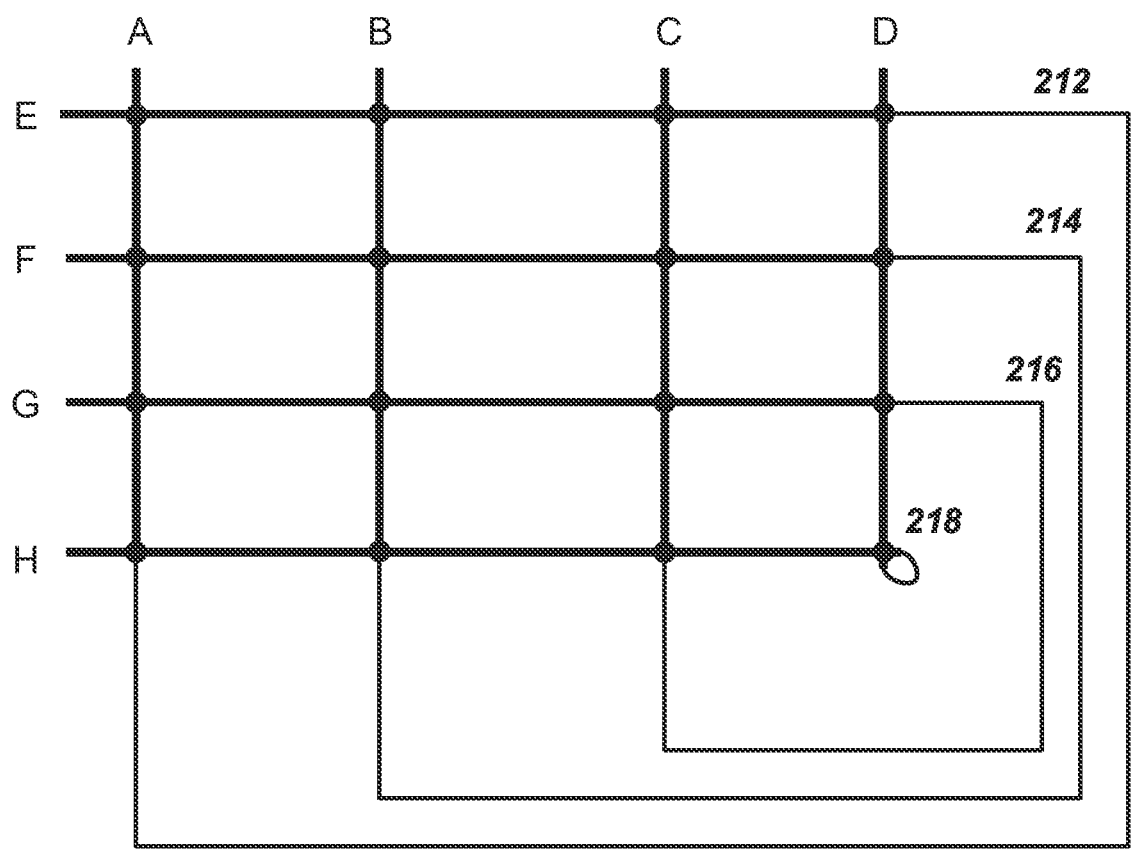
FIG. 2B is an example of a full connection in quantum hardware.

An example of a fully connected network is shown in FIG. 2B. FIG. 2B includes connections between "E" and "A" 212, "F" and "B" 214, "G" and "C" 216, and "H" and "D" 218. The network of FIG. 2B therefore allows for each cavity to interact with all other cavities.

The hardware of FIGS. 1, 2A, and 2B can be characterized by a Bose-Hubbard Hamiltonian:

$$H = \sum_i h_i n_i + \sum_{i,j} t_{ij}(a_i^\dagger a_j + h.c.) + \sum_i U_i n_i(n_i - 1)$$

where $n_i$ is the particle number operator and denotes the occupation number of a cavity mode i, $a_i^\dagger$ is a creation operator that creates a photon in cavity mode i, $a_j$ is an annihilation operator that annihilates a photon in cavity mode j, $h_i$ corresponds to a site disorder, $U_i$ corresponds to an on-site interaction, $t_{i,j}$ are the hopping matrix elements, and h.c. is the hermitian conjugate.

The hardware of FIGS. 1, 2A, and 2B, characterized by the Bose-Hubbard Hamiltonian above, can be used to determine solutions to problems by training the hardware as a Quantum Boltzmann Machine for probabilistic inference on Markov Random Fields. For example, a problem can be defined by a set of observables $y_i$, e.g., photon occupation number at a cavity of the hardware, and a goal is to infer underlying correlations among a set of hidden variables $x_j$. Assuming statistical independence among various pairs of $y_i$ and $x_j$, the joint probability distribution would be $$p(\{x_i\}, \{y_i\}) = 1/Z \prod_{i,j} \theta_{i,j}(x_i, x_j) \prod_i \alpha_i(x_i, y_i),$$

where Z is the partition function (which, for a given system with a fixed energy function or a given Hamiltonian, is constant), $\theta_{i,j}(x_i, x_j)$ is a pairwise correlation, and $\alpha_i(x_i, y_i)$ is the statistical dependency between a given pair of $y_i$ and $x_i$.

In training the hardware, certain cavity modes can act as the visible/observable input nodes of the Markov Random Field and can be used to train one or more of the Josephson couplers, which connect the hidden nodes $x_i$, to reproduce certain probability distribution of outcomes at the output visible nodes $y_i$.

For example, the training can be such that the delocalized energy ground state of the Bose-Hubbard model for each input state can have a probability distribution over the computational, i.e., localized, basis that resembles the output probability distribution function (PDF) of the training example, i.e., $p(\{x_i\}, \{y_i\})$. Thus, the thermalized state of the hardware trained as a Quantum Boltzmann Machine can be sampled to provide a probabilistic inference on the test data according to the Boltzmann distribution function.

For example, an energy function can be defined:

$$E(\{x_i\}, \{y_i\}) = -\sum_{i,j} t_{ij}(x_i, x_j) - \sum_i h_i(x_i, y_i)$$

where the nonlocal pairwise interactions $t_{i,j}(x_i, x_j) = \theta_{i,j}(x_i, x_j)$, and disordered local fields $h_i(x_i, y_i) = \alpha_i(x_i, y_i)$.

The Boltzmann distribution of the above energy function is then:

$$p(\{x_i\}, \{y_i\}) = \frac{1}{Z} e^{-\frac{E(\{x_i\},\{y_i\})}{T}},$$

where Z is the partition function.

In some other implementations, the quantum hardware of FIGS. 1, 2A, and 2B can be engineered or controlled to allow an additional type of coupling between the coupled cavities characterized by density-density interactions. With density-density interactions, an additional term can be added to the Bose-Hubbard Hamiltonian:

$$\sum_{i,j} U_{ij} n_i n_j,$$

The addition of the density-density interaction term to the Bose-Hubbard Hamiltonian can allow construction of a problem Hamiltonian in which the solution of a wide variety of problems can be encoded. For example, constraint functions of problems can have a digital representation according to the density of states in cavity QED modes with density-density interactions.

To account for photon loss in the above Hamiltonian, in some implementations the hardware is driven with additional fields to compensate for the loss.

Figure 3:
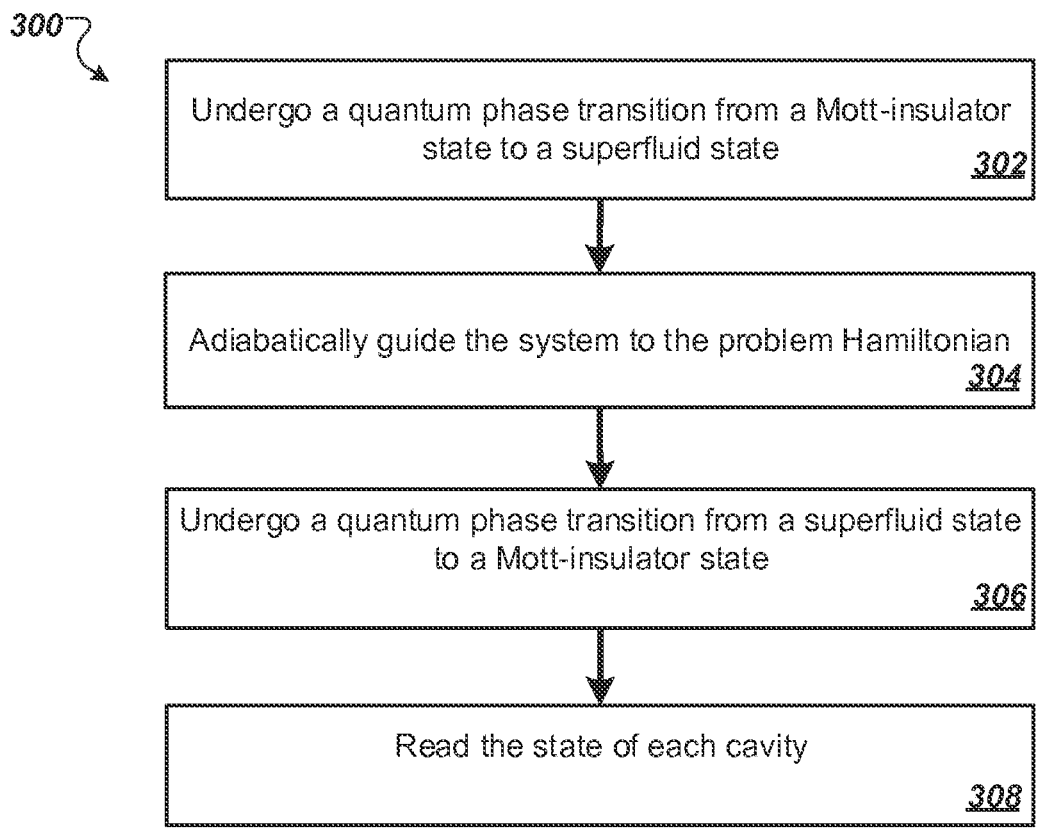
FIG. 3 is a flow diagram of an example process for encoding a problem in a Hamiltonian containing density-density interactions and programming quantum hardware.
Figure 4:
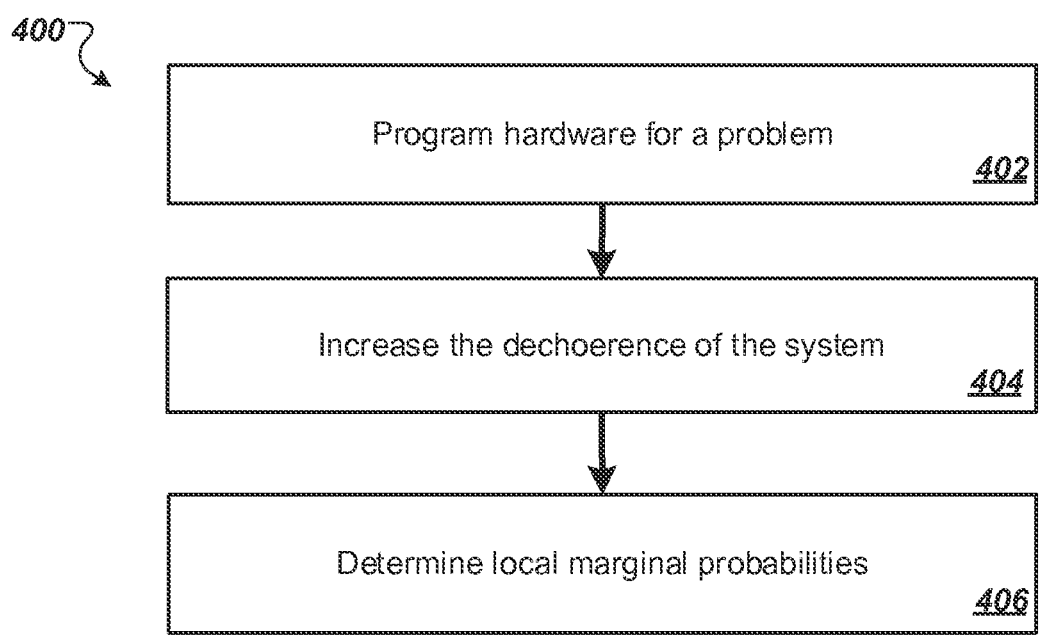
FIG. 4 is a flow diagram of an example process for encoding a problem in a dissipative-driven Hamiltonian and programming quantum hardware.

To provide the density-density interaction term in the Hamiltonian, the quantum hardware can be engineered (an example process of using the additionally engineered hardware is shown in FIG. 3) or by controlling the hardware using a dissipative-driven method (an example process of using the controlled hardware is shown in FIG. 4).

Using the quantum hardware of FIG. 1 as an example, the quantum hardware can additionally be engineered to include, e.g., Kerr non-linearity with Josephson Junction couplers, the Stark effect, or continuous-time C-phase gates between cavities.

The modified Hamiltonian characterizing the additionally engineered hardware is therefore:

$$H_{total} = \sum_i h_i n_i + \sum_{i,j} t_{ij}(a_i^\dagger a_j + h.c.) + \sum_i U_i n_i(n_i - 1) + \sum_{i,j} U_{ij} n_i n_j,$$

where the final term is the density-density interactions between cavities i and j.

In use for adiabatic computation, a time dependent Hamiltonian can be represented as:

$$H_{total} = (1-s)H_i + sH_p,$$

where s is a control parameter and can be a linear function of time, $H_i$ is the initial Hamiltonian:

$$H_i = \sum_{i,j} t_{ij}(a_i^\dagger a_j + h.c.),$$

and $H_p$ is the problem Hamiltonian into which the selected problem is encoded:

$$H_p = \Sigma_i h_i n_i + \Sigma_i U_i n_i(n_i-1) + \Sigma_{ij} U_{ij} n_i n_j.$$

When s=0, the hardware is placed into an initial ground state that is known. The hardware is then quais-adiabatically guided to s=1, moving the hardware to the ground state of the Hamiltonian encoded by the problem.

FIG. 3 is a flow diagram of an example process 300 for encoding a problem in a Hamiltonian containing density-density interactions and programming quantum hardware.

In solving a given problem, e.g., an optimization problem, a problem modeled as a Markov Random Field, or an NP-Hard problem, the hardware undergoes a quantum phase transition from a Mott-insulator state to a superfluid state (step 302). The hardware is initially in an insulated state with no phase coherence, and with localized wavefunctions only. The many-body state is therefore a product of local Fock states for each cavity in the hardware:

$$|\psi_M\rangle = \Pi_i a_i^N |0\rangle, \text{ where } N \text{ is the number of photons,}$$
and i is the cavity mode.

The hardware undergoes a quantum phase transition to a superfluid state so that the wavefunctions are spread out over the entire hardware:

$$|\psi_{SF}\rangle = \sum_i a_i^N |0\rangle$$

The hardware is adiabatically guided to a problem Hamiltonian (step 304). That is, the hardware is moved from the s=0 state, to the s=1 state as explained above.

At the end of the annealing process, the hardware transitions from a superfluid state to a non-trivial Mott-insulator state that can capture the solution to the problem (step 306).

The quantum state of the entire hardware is read out (step 308) and can be processed by a classical computer to provide solutions to the given problem. For example, the state of each cavity is determined by the photon occupation number of each cavity mode. The process 300 can be repeated multiple times for the given problem to provide solutions with a statistical distribution.

Alternatively, using the quantum hardware of FIG. 1 as an example, the dynamical effects of density-density interactions can be achieved by an interplay of the Bose-Hubbard Hamiltonian with cavity photon number fluctuations induced by an auxiliary external field. The combination of the hardware and the auxiliary external field is called a dissipative-driven hardware, and the Hamiltonian describing the dissipative-driven hardware is:

$$H_{BH} = \sum_i h_i n_i + \sum_{i,j} t_{ij}\left(a_i^\dagger a_j + h.c.\right) +$$
$$\sum_i U_i n_i (n_i - 1) + \sum_i \left[\varepsilon(t) a_i^\dagger + \varepsilon(t)^* a_i\right] + H_{SB}$$

where ε(t) is a slowly-varying envelope of an externally applied field to compensate for photon loss, and $H_{SB}$ is the Hamiltonian of the interaction between the hardware and the background bath in which the hardware is located:

$$H_{SB} = \sum_i \sum_\nu \left[\kappa_{i,\nu}\left(a_i b_\nu^\dagger + a_i^\dagger b_\nu\right) + \lambda_{i,\nu} a_i^\dagger a_i (b_\nu + b_\nu^\dagger)\right],$$

where $b_\nu$, and $b_\nu^\dagger$ are annihilation and creation operators for the bosonic background bath environment, $\kappa_{i,\nu}$ is the strength of hardware-bath interactions corresponding to the exchange of energy, $h_i$ corresponds to a site disorder, $U_i$ corresponds to an on-site interaction, $t_{i,j}$ are the hopping matrix elements, and $\lambda_{i,\nu}$ corresponds to the strength of local photon occupation fluctuations due to exchange of phase with the bath.

Using the dissipative-driven hardware, a solution to a problem can be determined without adiabatically guiding the hardware to the ground state of a problem Hamiltonian as in the process 300 of FIG. 3. The dissipative-driven hardware is eventually dominated by dissipative dynamics, defining a non-trivial steady state in which the solution to a problem is encoded.

FIG. 4 is a flow diagram of an example process 400 for encoding a problem in a dissipative-driven Hamiltonian and programming quantum hardware.

The hardware is programmed for a problem to be solved (step 402). In some implementations the problem is an optimization problem or an inference task and is mapped to a Markov Random Field. For example, a problem can be defined by a set of observables $y_i$, e.g., photon occupation number at a cavity of the hardware, and the goal is to infer underlying correlations among a set of hidden variables $x_i$. Assuming statistical independence among pair $y_i$ and $x_i$, the joint probability distribution would be:

$$p(\{x_i\}, \{y_i\}) = 1/Z \prod_{i,j} \theta_{i,j}(x_i, x_j) \prod_i \alpha_i(x_i, y_i),$$

where Z is a normalization constant, $\theta_{i,j}(x_i, x_j)$ is a pairwise correlation, and $\alpha_i(x_i, y_i)$ is the statistical dependency between a given pair of $y_i$ and $x_i$.

In many classes of machine learning problems, e.g., computer vision, image processing, and medical diagnosis, the goal of the problems is to compute marginal probabilities:

$$p(x_N) = \sum_{x1} \sum_{x2} \cdots \sum_{x_{N-1}} p(\{x_i\}, \{y_i\})$$

Using a density-matrix formulation, the marginal probabilities can be computed from the dynamics of the dissipative-driven hardware in a quantum trajectory picture:

$$\frac{d\rho}{dt} = -i[H_{BH} + H_{LS} + H_{decoh}, \rho] + \sum_{i,i',j,j'} \Gamma_{i,i',j,j'} a_i^\dagger a_{i'} \rho a_{j'}^\dagger a_j + \sum_i \Lambda_i a_i \rho a_i^\dagger,$$

where [ ] is the commutator, ρ is the density matrix, $H_{BH}$ is the Hamiltonian describing the dissipative-driven hardware, $H_{LS}$ is the Lamb shift, $H_{decoh}$ is an anti-Hermitian term proportional to the dechoerence rate of the hardware that leads to relaxation in the fixed excitation manifold and can be the Fourier transform of the bath correlation functions; $\Gamma_{i,i',j,j'}$ is a tensor describing the quantum jump rate among fixed-excitation manifolds, and $\Lambda_i$ is a tensor describing quantum jump rates between fixed-excitation manifolds.

The dechoerence of the hardware is gradually increased to drive the dynamics of the hardware to a classical regime steady state of dissipative dynamics that encodes the solution to the computational problem (step 404). After increasing the dechoerence, the dynamics of the dissipative-driven hardware can be simplified to:

$$\frac{d\rho}{dt} = -2H_{decoh}\rho + \sum_{i,i',j,j'} \Gamma_{i,i',j,j'} a_i^\dagger a_{i'} \rho a_{j'}^\dagger a_j$$

Local marginal probabilities can then be determined by the hardware and in some implementations a classical computer (step 406):

$$\frac{dtr[P_m \rho]}{dt} = -2tr[P_m H_{decoh}\rho] + \sum_{i,i',j,j'} \Gamma_{i,i',j,j'} tr[a_j^\dagger a_{j'} P_m a_i^\dagger a_{i'} \rho]$$

where tr[ ] is the trace operation which in a density-matrix formulation is used to determine the expectation value of an operator, and $P_m$ is a projector operator corresponding to the occupation density of a local cavity mode m.

The second term above retains density-density interactions between photons in a cavity mode i and in a cavity mode j that contribute to the number of photons in the visible cavity mode m. The second term further retains the $\Gamma_{i,i',j,j'}$ tensor which can be related to a Markov transition matrix, which is a matrix used in the problem if the problem can be described as a Markov Random Field.

In some implementations, the problem, e.g., a probabilistic inference, can be encoded in a quantum probability distribution of the dissipative Bose-Hubbard Hamiltonian or its extended engineered version; that is using the concept of quantum graphical models.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various hardware modules and components in the embodiments described above should not be understood as requiring such separation in all embodiments, and it should be understood that the described program components and hardwares can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of operating a quantum computing device comprising a plurality of superconducting cavities inductively coupled via Josephson junctions, the method comprising:

initializing the quantum computing device to an initial Mott-insulator state with no phase coherence and localized wavefunctions;

causing a quantum phase transition of the quantum computing device from the initial Mott-insulator state to a superfluid state; and adiabatically guiding the quantum computing device to a ground state encoded by a problem Hamiltonian.

2. The method of claim 1, further comprising:

causing a quantum phase transition of the quantum computing device from the ground state encoded by the problem Hamiltonian to a final Mott-insulator state; and reading the state of each superconducting cavity in the quantum computing device in the final Mott-insulator state.

3. The method of claim 2, wherein reading the state of each superconducting cavity in the quantum computing device comprises determining a photon occupation of each cavity mode.

4. The method of claim 2, wherein the problem Hamiltonian is characterized as $Hp=\Sigma_i h_i n_i + \Sigma_i U_i n_i(n_i-1) + \Sigma_{i,j} U_{i,j} n_i n_j$, where $n_i$ and $n_j$ are particle number operators denoting an occupation number of cavities i and j, respectively, $h_i$ and $h_j$ are representative of site disorder of cavities i and j, respectively, $U_i$ is an on-site interaction of cavity i, and $\Sigma_{i,j} U_{i,j} n_i n_j$ is a density-density interaction between cavity i and cavity j.

5. The method of claim 2, further comprising training the quantum computing device as a Quantum Boltzmann Machine, wherein training the quantum computing device as a Quantum Boltzmann Machine comprises:

training the quantum computing device for probabilistic inference on Markov Random Fields by defining a set of output visible nodes $y_i$, as different photon occupation numbers at a first plurality of superconducting cavities of the quantum computing device and configuring Josephson junctions coupling the first plurality of the superconducting cavities to a second plurality of the superconducting cavities and to reproduce certain probability distribution of outcomes at the output visible nodes $y_i$ when the second plurality of superconducting cavities are treated as corresponding to hidden nodes $x_i$ in the Markov Random Field.

6. The method of claim 5, wherein the training is such that: a delocalized energy ground state of a Bose-Hubbard model for each input state has a probability distribution over a computational basis that resembles an output probability distribution function (PDF) of a training example, $p(\{x_j\}, \{y_i\})$.

* * * * *